US010455721B2

(12) United States Patent
Miura

(10) Patent No.: US 10,455,721 B2
(45) Date of Patent: Oct. 22, 2019

(54) ELECTRONIC DEVICE

(71) Applicant: FANUC CORPORATION, Yamanashi (JP)

(72) Inventor: Daisuke Miura, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/225,471

(22) Filed: Dec. 19, 2018

(65) Prior Publication Data

US 2019/0200473 A1 Jun. 27, 2019

(30) Foreign Application Priority Data

Dec. 25, 2017 (JP) ................. 2017-247799

(51) Int. Cl.
H05K 7/14 (2006.01)
H05K 5/02 (2006.01)
H05K 5/00 (2006.01)
H01R 13/46 (2006.01)

(52) U.S. Cl.
CPC ........... H05K 7/1417 (2013.01); H01R 13/46 (2013.01); H05K 5/0013 (2013.01); H05K 5/0217 (2013.01)

(58) Field of Classification Search
CPC ............... H05K 7/1417; H05K 7/1418; H05K 7/1421–1425; H05K 5/0013; H05K 5/0217; H01R 13/46
USPC ......... 361/679.01, 679.02, 679.32, 727, 737, 361/741, 752, 756, 759, 801, 802, 810
See application file for complete search history.

(56) References Cited

U.S. PATENT DOCUMENTS 5,277,615 A * 1/1994 Hastings ................. G06F 1/181
361/679.32
2005/0122676 A1* 6/2005 Clark ................... H05K 7/1425
361/679.01

(Continued)

FOREIGN PATENT DOCUMENTS

JP 200077869 A 3/2000
JP 2002134963 A 5/2002

(Continued)

OTHER PUBLICATIONS

English Abstract for Japanese Publication No. 2014183139 A, published Sep. 29, 2014, 1 pg.

(Continued)

Primary Examiner — Steven T Sawyer
Assistant Examiner — Sagar Shrestha
(74) Attorney, Agent, or Firm — Fredrikson & Byron, P.A.

(57) ABSTRACT

In an electronic device, pairs of fixing jigs extend in a direction in which a circuit board is inserted, and the fixing jigs of each pair are disposed on the sides of both surfaces of the circuit board at a second interval longer than a first interval between a pair of guide rails provided in a slot. Pairs of jig guiding portions extend in a direction in which the circuit board is extracted, and the jig guiding portions of each pair are disposed on the sides of both surfaces of the circuit board such that the distal ends of the pair of jig guiding portions are disposed at a third interval longer than a sum of the second interval and the thicknesses of the distal ends of the pair of fixing jigs.

6 Claims, 5 Drawing Sheets

(56) References Cited

U.S. PATENT DOCUMENTS

2016/0143158 A1 5/2016 Wakana et al.
2019/0044452 A1* 2/2019 Arita ..................... H02M 1/32

FOREIGN PATENT DOCUMENTS

| | | |
|---|---|---|
| JP | 2002246772 A | 8/2002 |
| JP | 2014183139 A | 9/2014 |

OTHER PUBLICATIONS

English Abstract and Machine Translation for Japanese Publication No. 2002-246772 A, published Aug. 30, 2002, 7 pgs.
English Abstract and Machine Translation for Japanese Publication No. 2002-134963 A, published May 10, 2002, 9 pgs.
English Abstract and Machine Translation for Japanese Publication No. 2000-077869 A, published Mar. 14, 2000, 6 pgs.

* cited by examiner

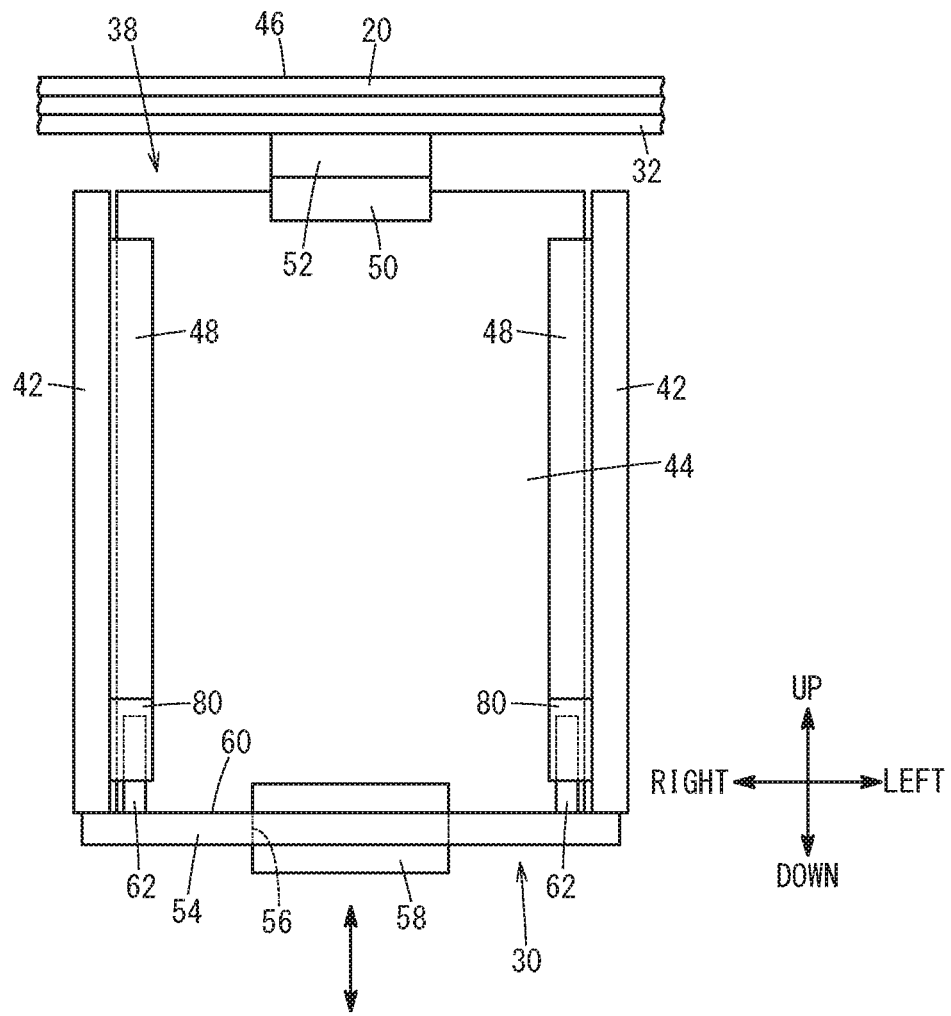

ELECTRONIC DEVICE

CROSS-REFERENCE TO RELATED APPLICATION

This application is based upon and claims the benefit of priority from Japanese Patent Application No. 2017-247799 filed on Dec. 25, 2017, the contents of which are incorporated herein by reference.

BACKGROUND OF THE INVENTION

Field of the Invention

The present invention relates to an electronic device in which a circuit board is inserted into a slot of a casing so as to fit together a first connector on the side of the circuit board and a second connector in the casing.

Description of the Related Art

Japanese Laid-Open Patent Publication No. 2002-246772 discloses an electronic device including a casing in which a slot is provided, a circuit board that is inserted in the slot, a first connector provided at an end of the circuit board in the direction in which the circuit board is inserted, a second connector that is provided in the casing and that is fitted with the first connector when the circuit board is inserted in the slot, and a pair of guide rails extending in the insertion direction in the casing, for guiding the circuit board inserted into the slot.

SUMMARY OF THE INVENTION

In the conventional technique, as mentioned above, the circuit board is fixed in the slot by fitting the first connector and the second connector together. Accordingly, when the casing or the circuit board vibrates, the fitted portion (the portion of contact) between the first connector and the second connector and the soldered portions of the second connector and the circuit board are subjected to loads. Then, if the circuit board is fixed in the slot by means of a member other than a casing, the number of parts of the electronic device and the number of assembly processing steps are increased, resulting in increased costs of the electronic device. On the other hand, when the circuit board in the slot is fixed by the guide rails, the circuit board rubs against the guide rails on the contacting portion, and then the circuit board will be scratched.

Accordingly, an object of the present invention is to provide an electronic device in which a circuit board inserted in a slot of a casing is securely fixed so as to ensure vibration resistance.

According to an aspect of the present invention, an electronic device includes a casing, a circuit board, a first connector, a faceplate, a second connector, pairs of guide rails, pairs of fixing jigs, and pairs of jig guiding portions.

A slot is provided in the casing and the circuit board is inserted in the slot. The first connector is provided at an end of the circuit board in an insertion direction. The faceplate is provided at an end of the circuit board in an extraction direction opposite to the insertion direction, and supports the circuit board. The second connector is provided in the casing and configured to be fitted to the first connector when the circuit board is inserted in the slot.

The pairs of guide rails are provided in the slot and extend in the insertion direction respectively on the sides of both ends of the circuit board which are spaced in a direction intersecting the insertion direction, so as to guide insertion of the circuit board into the slot. The guide rails of each pair are disposed at a first interval on the respective sides of both surfaces of the circuit board.

The pairs of fixing jigs are provided on the faceplate and extend in the insertion direction respectively on the sides of both ends of the circuit board, so as to fix the circuit board in the slot. The fixing jigs of each pair are disposed at a second interval that is longer than the first interval, on the respective sides of both surfaces of the circuit board.

The pairs of jig guiding portions are provided on an extraction side of the pairs of guide rails. The pairs of jig guiding portions extend in the extraction direction respectively on the sides of both ends of the circuit board, so as to elastically deform the pairs of fixing jigs in order to fix the circuit board when the circuit board is inserted into the slot. The jig guiding portions of each pair are disposed on the respective sides of both surfaces of the circuit board in such a manner that distal ends of the jig guiding portions of each pair are disposed at a third interval that is longer than a sum of the second interval and the thicknesses of distal ends of the fixing jigs of each pair.

According to the present invention, when the circuit board is inserted into the slot, the pairs of fixing jigs provided integrally with the circuit board via the faceplate are inserted respectively between the pairs of jig guiding portions and the circuit board. The pairs of fixing jigs are deformed elastically toward both surfaces of the circuit board by the pairs of jig guiding portions, so that the circuit board is pressed on both its surfaces by the pairs of jig guiding portions and the pairs of fixing jigs. As a result, it is possible to securely fix the circuit board inserted in the slot of the casing to ensure vibration resistance.

The above and other objects, features, and advantages of the present invention will become more apparent from the following description when taken in conjunction with the accompanying drawings, in which preferred embodiments of the present invention are shown by way of illustrative example.

BRIEF DESCRIPTION OF THE DRAWINGS

FIG. 5 is a schematic plan view showing the insertion of a circuit board into a slot.

DESCRIPTION OF THE PREFERRED EMBODIMENTS

The electronic device according to the present invention will be described in detail below with reference to the accompanying drawings in conjunction with a preferred embodiment.

Schematic Configuration of Preferred Embodiment

Figure 1:
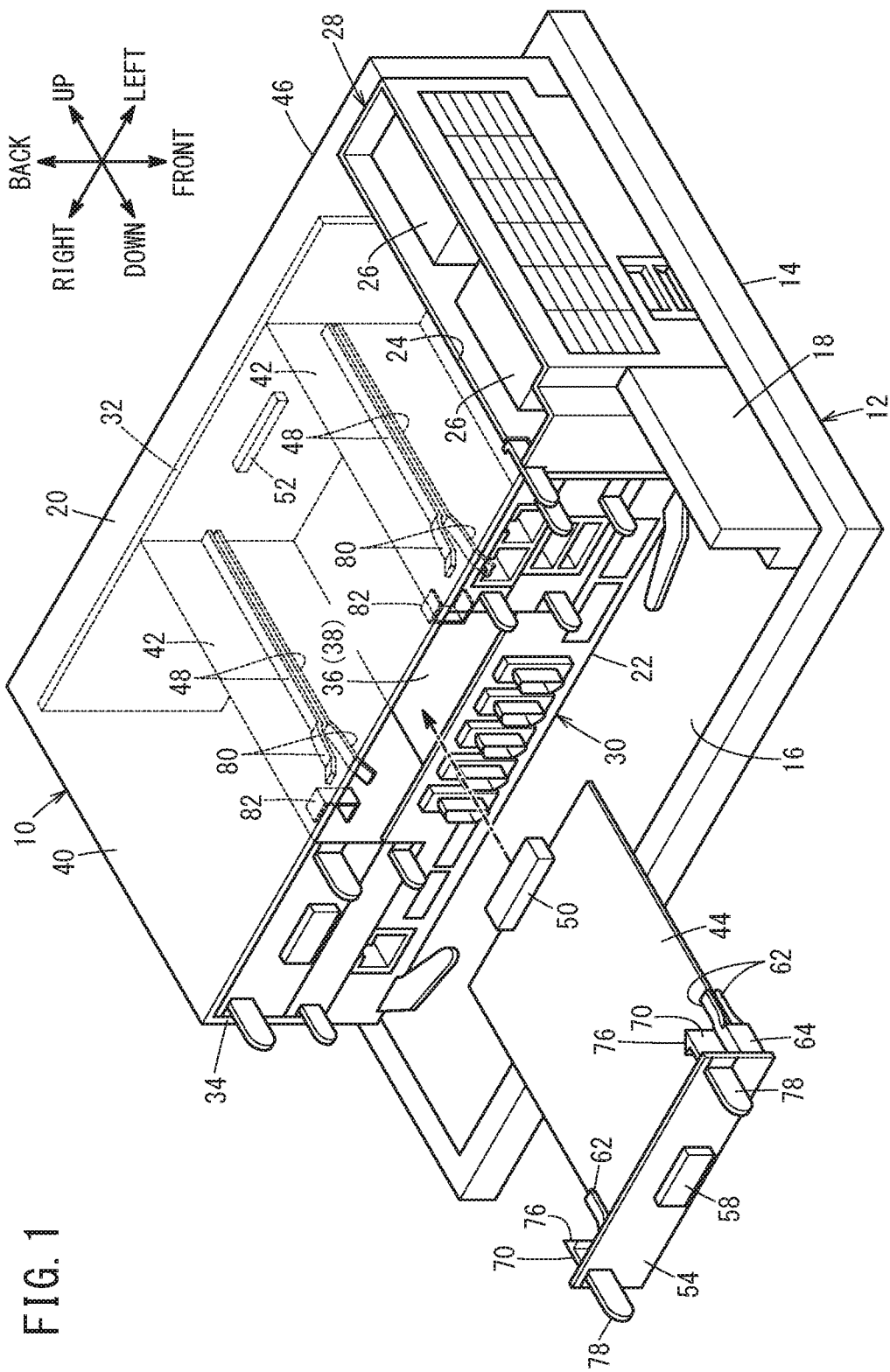
FIG. 1 is a perspective view showing an electronic device according to an embodiment of the present invention.

As shown in FIG. 1, an electronic device 10 of this embodiment is applied to a control device for controlling an indicator 12 and a non-illustrated industrial machine (e.g., a machine tool, robot, injection molding machine, wire electric discharge machine, etc.), for example. The indicator 12 is a liquid crystal display unit having a display screen (not shown) disposed on a front surface 14 thereof. The indicator 12 may be other type of display unit. FIG. 1 shows a case in which the electronic device 10 is applied to a numerical control device for a CNC (Computerized Numerical Control) machine tool. In this case, the indicator 12 is provided in a control panel of the machine tool. In the description below, it should be noted that the directions will be indicated as up-down, right-left, and front-back seen from the front of the display screen of the indicator 12.

The electronic device 10 and a user interface unit 18, which is connectable to external equipment (not shown), are detachably mounted on a back surface 16 of the indicator 12 which is opposite to the front surface 14. In this case, on the back surface 16 of the indicator 12, the electronic device 10 is detachably mounted on an upper side of the back surface 16 of the indicator 12. Also, on the back surface 16 of the indicator 12, the user interface unit 18 is detachably mounted in a corner on a lower side.

The electronic device 10 includes a box-shaped casing 20 which is detachably attached to the back surface 16 of the indicator 12. A bottom surface 22 of the casing 20 faces the back surface 16 of the indicator 12. Among the side surfaces of the casing 20 that adjoin the bottom surface 22, a fan unit 28 accommodating two fans 26 for cooling the interior of the casing 20 is detachably mounted to a side surface 24 of the casing 20 that is disposed closer to the user interface unit 18 and that extends in the up-down direction. The fan unit 28 may include at least a single fan 26.

As shown in FIGS. 1 to 5, the electronic device 10 includes the casing 20, a control unit 30 accommodated in the casing 20 and configured to control the indicator 12 and an industrial machine, and a back plate 32 accommodated in the casing 20 and connected to the control unit 30. Among the side surfaces of the casing 20 that adjoin the bottom surface 22 thereof, the under surface (a lower surface 34) adjoining the side surface 24, to which the fan unit 28 is attached, has a plurality of openings 36 with different shapes or sizes.

Inside the casing 20, a plurality of slots 38 are formed which extend from the respective openings 36 in the up-down direction parallel to the side surface 24 to which the fan unit 28 is attached. That is to say, inside the casing 20, a plurality of partition plates 42 extend to the bottom surface 22 of the casing 20 from a top plate 40 thereof opposite to the back surface 16 of the indicator 12. The casing 20 is thus partitioned into a plurality of spaces. Each of the plurality of divided spaces is formed as a slot 38, each slot 38 having an opening 36 formed on the side of the lower surface 34. Thus, all the slots 38 are provided in the lower surface 34 of the casing 20. In this embodiment, a plurality of partition plates that extend in the right-left direction may be further provided, and then the space in the casing 20 is divided in the front-back direction to form a plurality of slots 38.

As shown in FIGS. 1, 2, 4 and 5, the back plate 32 is a connection board connected to a plurality of circuit boards 44 constituting the control unit 30. The back plate 32 is disposed on the depth side in the direction to the upper side of the casing 20 (in the direction in which the circuit boards 44 are inserted), i.e., on the depth side in the direction to the upper side of the plurality of slots 38. The back plate 32 extends in parallel with the side surface of the casing 20 on the upper side (an upper surface 46 thereof) and perpendicularly to its bottom surface 22. The back plate 32 is connected to the indicator 12 through a connector (not shown).

As shown in FIGS. 1 to 5, the control unit 30 includes the plurality of circuit boards 44 accommodated respectively in the plurality of slots 38 in an insertable and extractable manner. The plurality of circuit boards 44 may have electronic components (not shown) mounted thereon. The plurality of slots 38 (openings 36) have different shapes or sizes from each other, and hence the plurality of circuit boards 44 have shapes or sizes corresponding to the shapes or sizes of the openings 36 so that the plurality of circuit boards 44 can be inserted into the corresponding ones of the slots 38. FIGS. 1 to 5 show an example in which a corresponding circuit board 44 is inserted into and extracted from one slot 38. For the sake of simplicity of description, FIGS. 3 to 5 only show part of the configuration.

In the casing 20, pairs of guide rails 48 are provided which extend in the up-down direction on the respective right and left sides of each slot 38 (on the sides of both ends of the circuit board 44 spaced in the right-left direction that intersects the insertion direction). On the partition plates 42 and the inner walls forming the sides of the casing 20, two guide rails 48 of each pair are spaced at a first interval d1 in the front-back direction of the casing 20 (on both surface sides of the circuit board 44). Thus, the pairs of guide rails 48 can guide the circuit board 44, inserted in the slot 38, in the insertion direction to the back plate 32, with both ends of the circuit board 44 fitted in the grooves between the pairs of guide rails 48. Further, the use of the pairs of guide rails 48 eliminates the need to position the circuit board 44 in the front-back direction and right-left direction when the circuit board 44 is inserted into the slot 38.

A first connector 50 is provided at an end of the circuit board 44 that is closer to the back plate 32 (at the end in the direction in which the circuit board 44 is inserted). Further, on the back plate 32, a plurality of second connectors 52 are provided which respectively fit to the first connectors 50 when the circuit boards 44 are inserted respectively in the plurality of slots 38. In this way, when accommodated in the slots 38, the circuit boards 44 can control the indicator 12 through the first connectors 50 and the second connectors 52 in the fitted state and the back plate 32. In FIG. 1, the configuration of the interior of the slot 38 is shown by broken line etc. for a case in which a circuit board 44 is inserted into and extracted from one slot 38.

Further, a faceplate 54 supporting the circuit board 44 is provided at the end of the direction in which the circuit board 44 is extracted (i.e., in the downward direction), which is opposite to the insertion direction. When the circuit board 44 has been inserted in the slot 38, the faceplate 54 abuts on the lower surface 34 of the casing 20 and closes the opening 36.

Figure 2:
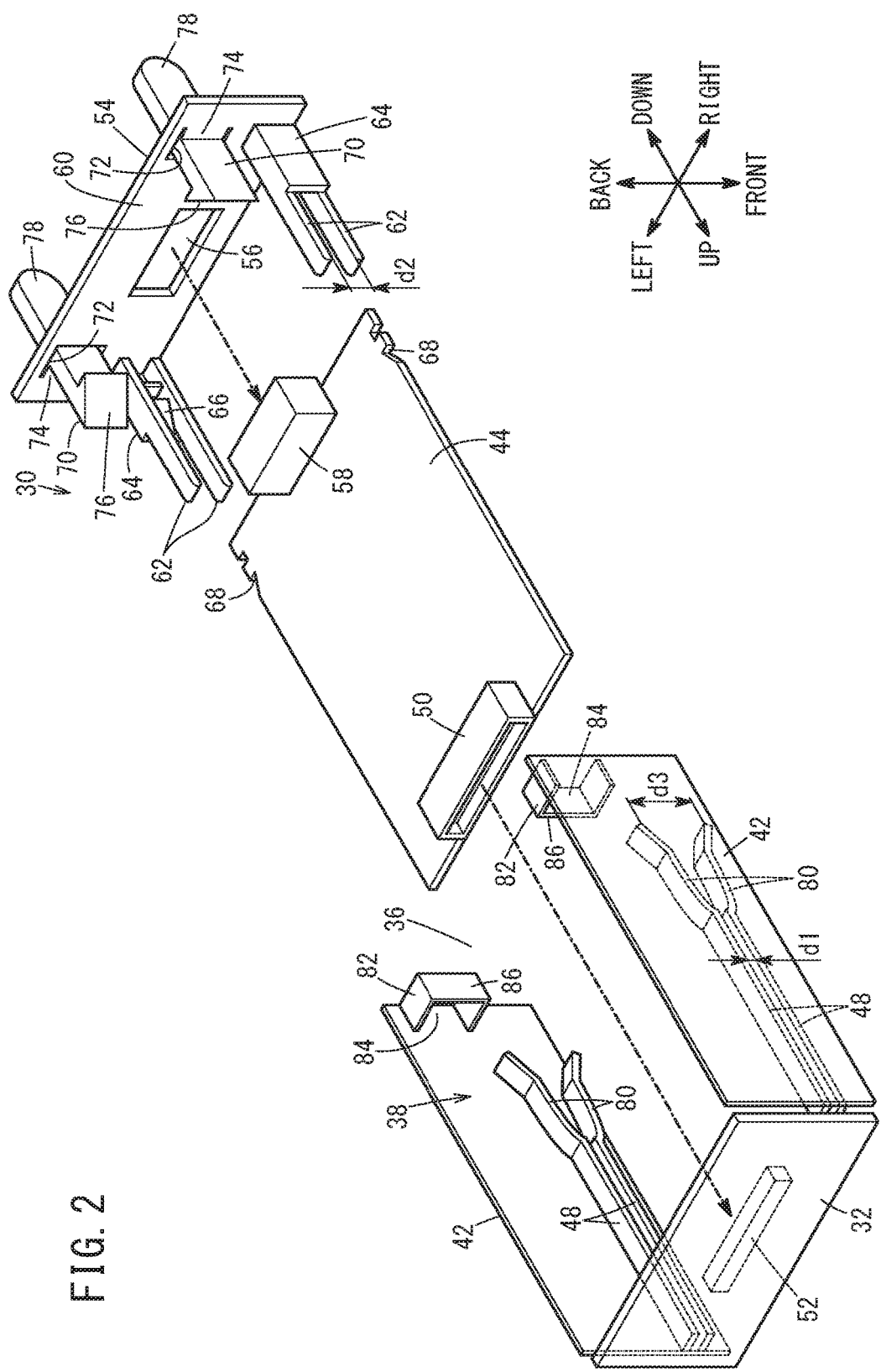
FIG. 2 is an exploded perspective view showing the configuration of a part of the electronic device of FIG. 1.

Furthermore, as shown in FIGS. 1, 2 and 5, a third connector 58 is provided at the end of the direction of extraction of the circuit board 44. The third connector 58 is exposed to the exterior through an opening 56 formed in the faceplate 54. The third connector 58 can be connected to an external connector. This makes it possible to supply signals from the outside to the circuit board 44 through the third connector 58, or to output signals from the circuit board 44 to the outside through the third connector 58.

In this way, by making the circuit board 44 as a unit, the circuit board 44 can be easily packaged and carried about, and measures against static electricity can be easily taken for the circuit board 44.

Characteristic Features of Present Embodiment

Next, characteristic features of the electronic device 10 of this embodiment will be described with reference to FIGS. 1 to 5. The electronic device 10 further includes the features described below in order to suppress vibration of the circuit board 44 accommodated in the slot 38, when the circuit board 44 is inserted in the slot 38 and the first connector 50 and the second connector 52 are fitted together.

On a surface of the faceplate 54 on the insertion side (an upper surface 60 thereof), pairs of fixing jigs 62 are provided which extend in the insertion direction respectively along both ends of the circuit board 44. The fixing jigs 62 of each pair are disposed at a second interval d2 that is longer than the first interval d1, on the sides of both surfaces of the circuit board 44 (in the front-back direction). The distal ends of the pair of fixing jigs 62 are elastically deformable.

The proximal ends of the pair of fixing jigs 62 are joined together by a rectangular joint portion 64 provided on the upper surface 60 of the faceplate 54. The inner sides of the two joint portions 64 in the right-left direction have respective engaging portions 66 that have concavity and convexity. Also, engaging portions 68 as notches to be engaged with the engaging portions 66 of the two joint portions 64 are formed in both ends of the circuit board 44 on the extraction side. The circuit board 44 is supported by the faceplate 54 through the engagement of the two engaging portions 68 and the engaging portions 66 of the two joint portions 64. In this case, the circuit board 44 is supported by the faceplate 54, with the end of the circuit board 44 on the extraction side being in contact with the upper surface 60 of the faceplate 54, and with both ends of the circuit board 44 on the extraction side being held and sandwiched in the right-left direction by the engaging portions 66 of the two joint portions 64. In the side view of FIG. 4, the circuit board 44 is thus supported by the faceplate 54 in such a manner that it extends along the insertion direction between the pair of fixing jigs 62.

Figure 3:
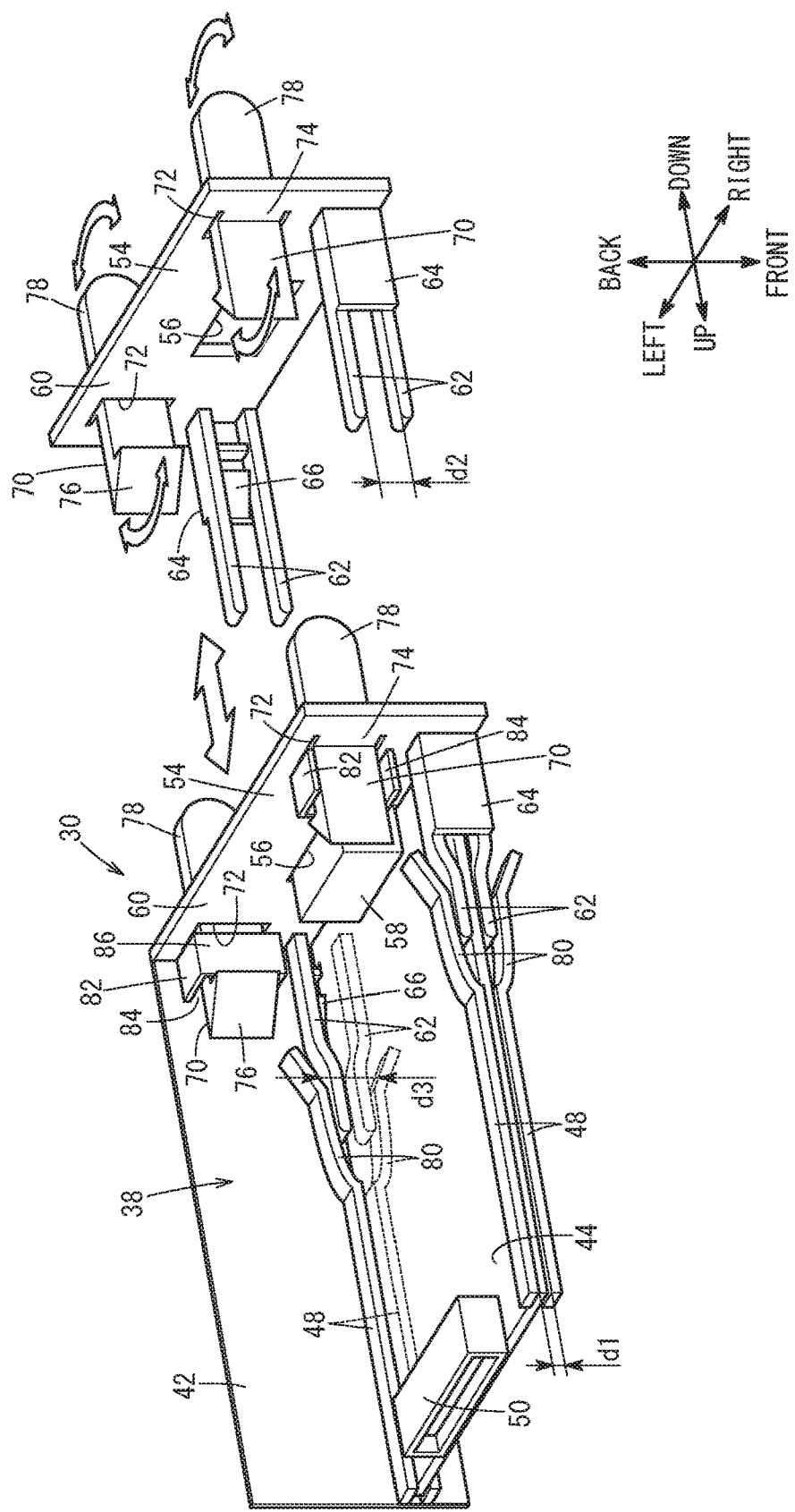
FIG. 3 is a perspective view schematically showing insertion of a circuit board into a slot.

Further, as shown in FIG. 3, on the upper surface 60 of the faceplate 54, first fitting portions 70 are provided respectively on the sides of both ends of the circuit board 44 and extend in the insertion direction. In this case, the faceplate 54 has openings 72 formed respectively on the sides of both ends of the circuit board 44. Each opening 72 has a supporting portion 74 extending inwardly in the right-left direction of the faceplate 54 (toward the third connector 58). Each first fitting portion 70 extends along the insertion direction with its proximal end supported by the supporting portion 74. The first fitting portion 70 has a claw 76 formed at its distal end and protruding inwardly in the right-left direction of the faceplate 54.

Manipulated portions 78 extending along the extraction direction are provided respectively to the two supporting portions 74. The first fitting portion 70 and the manipulated portion 78 are thus joined in the up-down direction via the supporting portion 74. As shown in FIGS. 2 and 3, when an operator manipulates the manipulated portions 78 in the right-left direction, the supporting portions 74 bend and the first fitting portions 70 turn in the direction opposite to the movement of the manipulated portions 78. For example, when the two manipulated portions 78 are manipulated inwardly in the right-left direction of the faceplate 54 about the supporting portions 74, then the two first fitting portions 70 turn outwardly in the right-left direction of the faceplate 54 about the supporting portions 74.

On the other hand, as shown in FIGS. 1 to 5, the slot 38 has pairs of jig guiding portions 80 provided on the extraction side of the pairs of guide rails 48, respectively on the sides of both ends of the circuit board 44. The jig guiding portions 80 of each pair are elastically deformable and disposed at a third interval d3 in the front-back direction to extend along the extraction direction on the sides of both surfaces of the circuit board 44. The pairs of jig guiding portions 80 may be provided separately from the partition plate 42 and the inner wall of the casing 20 on the extraction side of the pairs of guide rails 48. Alternatively, the pairs of jig guiding portions 80 may be provided integrally with the partition plate 42 and the inner wall of the casing 20 on the extraction side of the pairs of guide rails 48.

The third interval d3 between the distal ends of jig guiding portions 80 of the pair is set to be longer than the sum of the thicknesses of the distal ends of the pair of fixing jigs 62 and the second interval d2 between the paired fixing jigs 62 before deformed elastically (see FIGS. 2 and 3). Accordingly, when the circuit board 44 is inserted into the slot 38, the pair of fixing jigs 62 can be inserted between the pair of jig guiding portions 80 and both surfaces of the circuit board 44 (see FIGS. 3 to 5). If the distal ends of the pair of fixing jigs 62 are formed in a protruding form and the thickness of the distal ends of the pair of fixing jigs 62 is zero, then it is sufficient to set the third interval d3 longer than the second interval d2.

Figure 4:
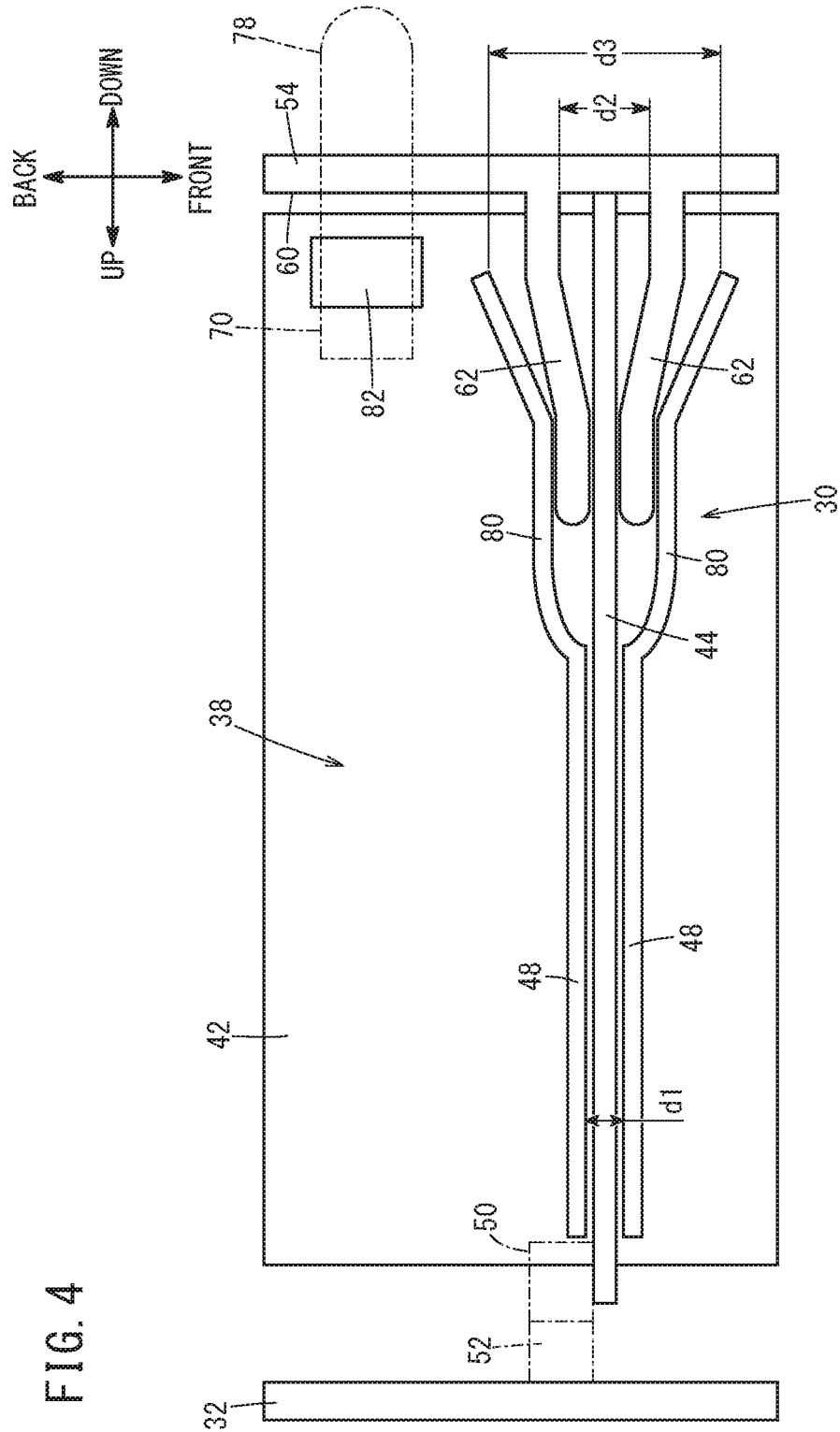
FIG. 4 is a side view schematically showing the insertion of a circuit board into a slot.

The third interval d3 gradually becomes shorter from the distal ends of the pair of jig guiding portions 80 in the insertion direction (toward the pair of guide rails 48). Accordingly, when the pair of fixing jigs 62 abut on the pair of jig guiding portions 80, the pair of fixing jigs 62 are gradually deformed elastically by the pair of jig guiding portions 80 toward both surfaces of the circuit board 44, as the circuit board 44 is inserted in the insertion direction. Also, as shown in FIG. 4, the pair of jig guiding portions 80 are deformed elastically by the pair of fixing jigs 62 in the front-back direction of the casing 20 in a portion where the third interval d3 is shorter than the sum of the second interval d2 and the thicknesses of the distal ends of the pair of fixing jigs 62.

Furthermore, second fitting portions 82 to be fitted with the first fitting portions 70 are provided on the partition plate 42 and the inner wall of the casing 20, respectively on the sides of both ends of the circuit board 44 in the slot 38. The second fitting portions 82 are engaging portions that are formed on the partition plate 42 and the inner wall of the casing 20 and that protrude inwardly in the right-left direction of the slot 38 from positions located closer to the extraction side than the distal ends of the pairs of jig guiding portions 80 are. The second fitting portions 82 each have an opening passing in the up-down direction. Thus, when the circuit board 44 is inserted in the slot 38, the first fitting portions 70 respectively pass through the openings 84 of the second fitting portions 82, and the claws 76 of the first fitting portions 70 respectively engage with the inner portions 86, which are located inside in the right-left direction, of the second fitting portions 82. The second fitting portions 82 are disposed in such positions that when the circuit board 44 is inserted in the slot 38 and the claws 76 of the first fitting portions 70 engage with the second fitting portions 82, the first connector 50 and the second connector 52 fit together and the faceplate 54 covers the opening 36.

Insertion/Extraction of Circuit Board 44 into/from Slot 38

Next, the process of inserting and extracting the circuit board 44 into and from the slot 38 will be described. First, a case of inserting the circuit board 44 into the slot 38 will be described.

When the circuit board 44 is supported by the faceplate 54, the circuit board 44 is inserted into the slot 38 with the first connector 50 directed to the insertion side. Then, both ends of the circuit board 44 on the insertion side are put between the pairs of guide rails 48 through the pairs of jig guiding portions 80. As a result, the circuit board 44 can be moved toward the back plate 32, with both ends of the circuit board 44 being guided by the pairs of guide rails 48. That is to say, the circuit board 44 is inserted into the slot 38 while being positioned in the right-left direction and the front-back direction by the pairs of guide rails 48.

As has been described earlier, the third interval d3 between the distal ends of the pair of jig guiding portions 80 is longer than the sum of the second interval d2 between the paired fixing jigs 62 and the thicknesses of the distal ends of the pair of fixing jigs 62. Accordingly, as the circuit board 44 is moved further forward, the pairs of fixing jigs 62 are inserted respectively between the pairs of jig guiding portions 80 and both surfaces of the circuit board 44.

Furthermore, the third interval d3 becomes gradually shorter from the distal ends of the pair of jig guiding portions 80 toward the pair of guide rails 48 (along the insertion direction). Therefore, as shown in FIG. 3, when the distal ends of the pair of fixing jigs 62 are thus inserted and abut on the pair of jig guiding portions 80, the distal ends of the pair of fixing jigs 62 are deformed elastically toward both surfaces of the circuit board 44. As a result, the distal ends of the pair of fixing jigs 62 come in contact with both surfaces of the circuit board 44, and both surfaces of the circuit board 44 are pressed in the front-back direction from the pair of jig guiding portions 80 through the pair of fixing jigs 62.

Therefore, the circuit board 44 can be positioned and fixed in the front-back direction even in a state in which there are gaps between both ends of the circuit board 44 and the pairs of guide rails 48. Further, since both surfaces of the circuit board 44 are fixed by the pairs of fixing jigs 62, slight gaps are formed between the pairs of guide rails 48 and both surfaces of the circuit board 44. As a result, it is possible to insert the circuit board 44 into the slot 38 in the insertion direction while preventing occurrence of scratches on the circuit board 44 due to friction between the pairs of guide rails 48 and the circuit board 44, while guiding both ends of the circuit board 44 with the pairs of guide rails 48.

Also, as shown in FIG. 4, on the insertion side of the pair of jig guiding portions 80 where the third interval d3 is shorter than the sum of the second interval d2 and the thicknesses of the distal ends of the pair of fixing jigs 62, the pair of jig guiding portions 80 are subjected to a pressing force from the pair of fixing jigs 62 and deformed elastically in the front-back direction of the casing 20. In this case, the circuit board 44 is inserted in the insertion direction while the pair of fixing jigs 62 press apart the pair of jig guiding portions 80 in the front-back direction.

As the circuit board 44 is inserted further forward, the end of the circuit board 44 on the insertion side comes near the back plate 32, and the first connector 50 and the second connector 52 are fitted together. Also, the first fitting portions 70 pass through the openings 84 of the second fitting portions 82, and the claws 76 of the first fitting portions 70 engage with the inner portions 86 of the second fitting portions 82. The circuit board 44 is thus positioned and fixed in the right-left direction in the slot 38. Furthermore, the faceplate 54 closes the opening 36 of the slot 38. The circuit board 44 is thus positioned and fixed in the up-down direction in the slot 38. Still further, as described above, the circuit board 44 is positioned in the front-back direction by the pairs of jig guiding portions 80 and the pairs of fixing jigs 62.

In this way, when accommodated in the slot 38, the circuit board 44 is positioned and fixed in the front-back direction, the up-down direction, and the right-left direction. This effectively suppresses vibration of the circuit board 44. Consequently, it is possible to prevent loads from being applied to the fitted portion (the portion of contact) between the first connector 50 and the second connector 52 and the soldered portions of the second connector 52 and the circuit board 44.

On the other hand, when the circuit board 44 is extracted from the slot 38, the operator first manipulates the two manipulated portions 78, which are exposed outside from the faceplate 54, inwardly in the right-left direction of the faceplate 54. Then, the supporting portions 74 bend and the first fitting portions 70 fitted in the second fitting portions 82 turn outwardly in the right-left direction of the faceplate 54 about the supporting portions 74. As a result, the fitted state between the claws 76 of the first fitting portions 70 and the inner portions 86 of the second fitting portions 82 is released.

Next, while manipulating the two manipulated portions 78 inwardly in the right-left direction of the faceplate 54, the operator pulls the faceplate 54 in the extraction direction. The fitted state between the first connector 50 and the second connector 52 is then released.

Next, as the operator further pulls the faceplate 54 in the extraction direction, the first connector 50 and the circuit board 44 separate away from the second connector 52 in the extraction direction. Thus, the circuit board 44 can be pulled out in the extraction direction while both ends of the circuit board 44 are guided by the pairs of guide rails 48. In this case, the first fitting portions 70 separate away from the second fitting portions 82, and the pairs of fixing jigs 62 also separate away from the pairs of jig guiding portions 80. The pairs of fixing jigs 62 then return to the original positions by a restoring force by elastic deformation. As a result, both surfaces of the circuit board 44 are released from the pressed state by the pairs of jig guiding portions 80 and the pairs of fixing jigs 62.

In this state, the operator further pulls out the faceplate 54 in the extraction direction, so as to extract the circuit board 44 out from the opening 36 of the slot 38. Incidentally, when the first fitting portions 70 are separated from the second fitting portions 82, the operator can pull out the circuit board 44 from the opening 36 of the slot 38 with the manipulated portions 78 returned to the original positions.

Technical Concepts Obtained from Embodiment

Technical concepts offered by the above-described embodiment will be described below.

The electronic device (10) includes a casing (20), a circuit board (44), a first connector (50), a faceplate (54), a second connector (52), pairs of guide rails (48), pairs of fixing jigs (62), and pairs of jig guiding portions (80).

A slot (38) is provided in the casing (20) and the circuit board (44) is inserted in the slot (38). The first connector (50) is provided at an end of the circuit board (44) in an insertion direction. The faceplate (54) is provided at an end of the circuit board (44) in an extraction direction opposite to the insertion direction, and supports the circuit board (44). The second connector (52) is provided in the casing (20) and configured to be fitted to the first connector (50) when the circuit board (44) is inserted in the slot (38).

The pairs of guide rails (48) are provided in the slot (38) and extend in the insertion direction respectively on the sides of both ends of the circuit board (44) which are spaced in a direction intersecting the insertion direction, so as to guide insertion of the circuit board (44) into the slot (38). The guide rails (48) of each pair are disposed at a first interval (d1) on the respective sides of both surfaces of the circuit board (44).

The pairs of fixing jigs (62) are provided on the faceplate (54) and extend in the insertion direction respectively on the sides of both ends of the circuit board (44), so as to fix the circuit board (44) in the slot (38). The fixing jigs (62) of each pair are disposed at a second interval (d2) that is longer than the first interval (d1), on the respective sides of both surfaces of the circuit board (44).

The pairs of jig guiding portions (80) are provided on an extraction side of the pairs of guide rails (48). The pairs of jig guiding portions (80) extend in the extraction direction respectively on the sides of both ends of the circuit board (44), so as to elastically deform the pairs of fixing jigs (62) in order to fix the circuit board (44) when the circuit board (44) is inserted into the slot (38). The jig guiding portions (80) of each pair are disposed on the respective sides of both surfaces of the circuit board (44) in such a manner that the distal ends of the jig guiding portions (80) of each pair are disposed at a third interval (d3) that is longer than a sum of the second interval (d2) and thicknesses of distal ends of the fixing jigs (62) of each pair.

In accordance with this configuration, when the circuit board (44) is inserted into the slot (38), the pairs of fixing jigs (62) provided integrally with the circuit board (44) via the faceplate (54) are inserted respectively between the pairs of jig guiding portions (80) and the circuit board (44). The pairs of fixing jigs (62) are deformed elastically toward both surfaces of the circuit board (44) by the pairs of jig guiding portions (80), so that the circuit board (44) is pressed on both its surfaces by the pairs of jig guiding portions (80) and the pairs of fixing jigs (62). As a result, it is possible to securely fix the circuit board (44) inserted in the slot (38) of the casing (20) to ensure vibration resistance.

At each of the sides of both ends of the circuit board (44), the third interval (d3) gradually becomes shorter in the insertion direction from the distal ends of the jig guiding portions (80) of the pair. Therefore, when the circuit board (44) is inserted in the slot (38) and the pair of fixing jigs (62) are inserted between the pair of jig guiding portions (80) and both surfaces of the circuit board (44), the pair of jig guiding portions (80) gradually deform the pair of fixing jigs (62) elastically toward both surfaces of the circuit board (44). As a result, it is possible to securely and effectively fix the circuit board (44) inserted in the slot (38).

The electronic device (10) further includes first fitting portions (70) provided on the faceplate (54) and extending in the insertion direction respectively on the sides of both ends of the circuit board (44), and second fitting portions (82) provided in the slot (38) and configured to be fitted to the first fitting portions (70) respectively on the sides of both ends of the circuit board (44). In accordance with this configuration, the circuit board (44) inserted in the slot (38) can be easily positioned and fixed in the direction intersecting the insertion direction.

The electronic device (10) further includes manipulated portions (78) provided on the faceplate (54) and configured to release a fitted state between the first fitting portions (70) and the second fitting portions (82) respectively on the sides of both ends of the circuit board (44). In accordance with this configuration, the circuit board (44) accommodated in the slot (38) can be easily extracted from the slot (38).

The electronic device (10) further includes a back plate (32) which is provided in the casing (20) and on which the second connector (52) is disposed. In accordance with this configuration, it is possible to perform transmission and reception of signals between the circuit board (44) and the back plate (32) when the circuit board (44) is inserted in the slot (38) and the first connector (50) and the second connector (52) are fitted together.

The electronic device (10) further includes a third connector (58) provided at an end of the circuit board (44) in the extraction direction. In accordance with this configuration, it is possible to supply signals from the outside to the circuit board (44) through the third connector (58), or to output signals to the outside from the circuit board (44) through the third connector (58).

The present invention is not particularly limited to the embodiment described above, and various modifications are possible without departing from the essence and gist of the present invention.

What is claimed is:

1. An electronic device, comprising:
   a casing in which a slot is provided;
   a circuit board configured to be inserted in the slot;
   a first connector provided at an end of the circuit board in an insertion direction;
   a faceplate provided at an end of the circuit board in an extraction direction opposite to the insertion direction and configured to support the circuit board;
   a second connector provided in the casing and configured to be fitted to the first connector when the circuit board is inserted in the slot;
   pairs of guide rails provided in the slot and extending in the insertion direction respectively on sides of both ends of the circuit board which are spaced in a direction intersecting the insertion direction, so as to guide insertion of the circuit board into the slot, the guide rails of each pair being disposed at a first interval on respective sides of both surfaces of the circuit board;
   pairs of fixing jigs provided on the faceplate and extending in the insertion direction respectively on the sides of both ends of the circuit board, so as to fix the circuit board in the slot, the fixing jigs of each pair being disposed at a second interval that is longer than the first interval, on the respective sides of both surfaces of the circuit board; and
   pairs of jig guiding portions provided on an extraction side of the pairs of guide rails, and extending in the extraction direction respectively on the sides of both ends of the circuit board, so as to elastically deform the pairs of fixing jigs in order to fix the circuit board when the circuit board is inserted into the slot, the jig guiding portions of each pair being disposed on the respective sides of both surfaces of the circuit board in a manner that distal ends of the jig guiding portions of each pair are disposed at a third interval that is longer than a sum of the second interval and thicknesses of distal ends of the fixing jigs of each pair.

2. The electronic device according to claim 1, wherein, at each of the sides of both ends of the circuit board, the third interval gradually becomes shorter in the insertion direction from the distal ends of the jig guiding portions of the pair.

3. The electronic device according to claim 1, further comprising, first fitting portions provided on the faceplate and extending in the insertion direction respectively on the sides of both ends of the circuit board, and second fitting portions provided in the slot and configured to be fitted to the first fitting portions respectively on the sides of both ends of the circuit board.

4. The electronic device according to claim 3, further comprising manipulated portions provided on the faceplate and configured to release a fitted state between the first fitting portions and the second fitting portions respectively on the sides of both ends of the circuit board.

5. The electronic device according to claim 1, further comprising a back plate which is provided in the casing and on which the second connector is disposed.

6. The electronic device according to claim 1, further comprising a third connector provided at the end of the circuit board in the extraction direction.

* * * * *